United States Patent
Uhlig et al.

(10) Patent No.: US 8,405,157 B2
(45) Date of Patent: Mar. 26, 2013

(54) BIPOLAR INTEGRATION WITHOUT ADDITIONAL MASKING STEPS

(75) Inventors: Thomas Uhlig, Dresden (DE); Felix Fuernhammer, Dresden (DE); Christoph Ellmers, Dresden (DE)

(73) Assignee: X-FAB Semiconductor Foundries AG, Erfurt (DE)

( * ) Notice: Subject to any disclaimer, the term of this patent is extended or adjusted under 35 U.S.C. 154(b) by 457 days.

(21) Appl. No.: 12/593,316

(22) PCT Filed: Mar. 26, 2008

(86) PCT No.: PCT/EP2008/053555
§ 371 (c)(1),
(2), (4) Date: Mar. 3, 2010

(87) PCT Pub. No.: WO2008/116875
PCT Pub. Date: Oct. 2, 2008

(65) Prior Publication Data
US 2010/0148276 A1   Jun. 17, 2010

(30) Foreign Application Priority Data

Mar. 26, 2007 (DE) .................. 10 2007 016 090
Jul. 23, 2007 (DE) .................. 10 2007 034 801

(51) Int. Cl.
*H01L 29/66* (2006.01)
(52) U.S. Cl. ............... 257/378; 257/517; 257/E27.015
(58) Field of Classification Search .................. 257/370, 257/273, 378, 511, 517
See application file for complete search history.

(56) References Cited

U.S. PATENT DOCUMENTS 4,299,024 A * 11/1981 Piotrowski ............... 438/203
5,793,085 A    8/1998 Vajana et al.
6,198,330 B1 * 3/2001 Hopkins .................. 327/333
(Continued)

FOREIGN PATENT DOCUMENTS

DE   39 16 707    1/1990
DE   44 01 470    9/1994
(Continued)

OTHER PUBLICATIONS

Quirk, Michael et al. *Semiconductor Manufacturing Technology*. NJ, Prentice-Hall, Inc., 2001. p. 58-59.*

(Continued)

*Primary Examiner* — Thao Le
*Assistant Examiner* — Allen Parker
(74) *Attorney, Agent, or Firm* — Hunton & Williams LLP

(57) ABSTRACT

The invention relates to a BiMOS semiconductor component having a semiconductor substrate wherein, in a first active region, a depletion-type MOS transistor is formed comprising additional source and drain doping regions of the first conductivity type extending in the downward direction past the depletion region into the body doping region while, in a second active region, (101), a bipolar transistor (100) is formed, the base of which comprises a body doping region (112) and the collector of which comprises a deep pan (110), wherein an emitter doping region (114) of the first conductivity type and a base connection doping region (118) of the second conductivity type are formed in the body doping region. The semiconductor element can be produced with a particularly low process expenditure because it uses the same basic structure for the doping regions in the bipolar transistor as are used in the MOS transistor of the same semiconductor component.

16 Claims, 1 Drawing Sheet

U.S. PATENT DOCUMENTS

| | | | |
|---|---|---|---|
| 6,303,420 B1 | 10/2001 | Sridhar et al. | |
| 2002/0145167 A1* | 10/2002 | Yamazaki | 257/370 |
| 2004/0235233 A1 | 11/2004 | Lee et al. | |

FOREIGN PATENT DOCUMENTS

| | | |
|---|---|---|
| EP | 1 030 363 | 8/2000 |
| EP | 1 071 133 | 1/2001 |
| JP | 2001308104 | 11/2001 |

OTHER PUBLICATIONS

International Search Report for PCT/EP2008/053555 mailed Jul. 11, 2008, 3 pages.

Zhu, et al., "Suppression of substarte injection by RESURF LDMOS devices in a smart power technology for 20-30V applications", Transportation Silicon Technology Center, Motorola SPS; IEEE BCTM; Sep. 27, 1998; pp. 184-186.

Parthasarathy, et al., "A 33V, 0.25mΩ-cm$^2$ n-channel LDMOS in a 0.65μm smart power technology for 20-30V applications", Transportation Silicon Technology Center, Motorola SPS; Proceedings of 1998 International Symposium on Power Semiconductor Devices & ICs, Kyoto; Jun. 3, 1998; pp. 61-64.

Sze, S.M., "Semiconductor Devices, Phhysics and Technology", John Wiley and Sons, New York, 1985; pp. 405-415.

* cited by examiner

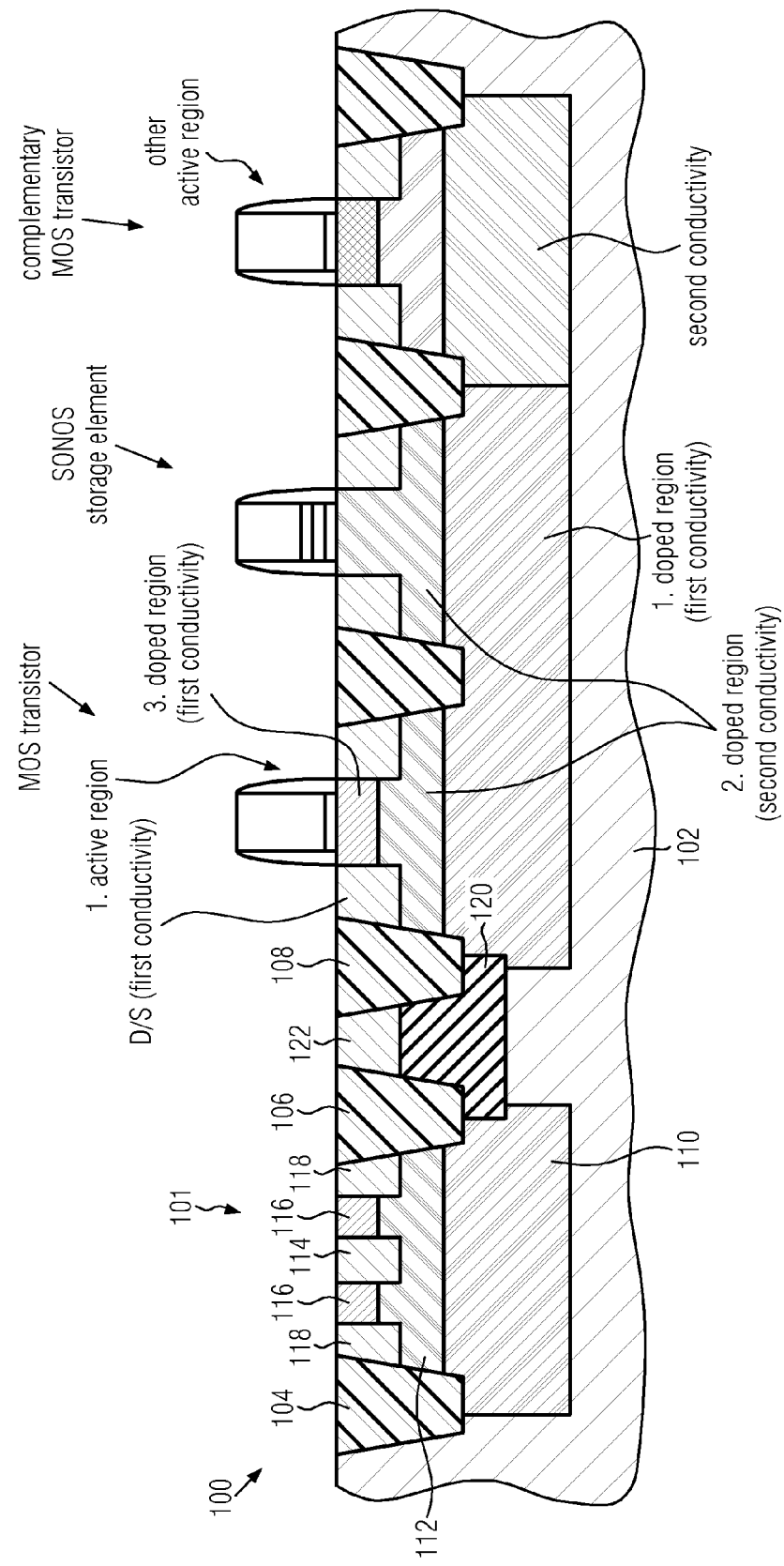

BIPOLAR INTEGRATION WITHOUT ADDITIONAL MASKING STEPS

CROSS-REFERENCE TO RELATED APPLICATIONS

The application is a U.S. National Stage Application of International Application of PCT/EP2008/053555 filed Mar. 26, 2008, which claims the benefit of German Patent Application No. 10 2007 016 090.0 filed Mar. 26, 2007 and German Patent Application No. 10 2007 034 801.2 filed Jul. 23, 2007, the disclosures of which are herein incorporated by reference in their entirety.

FIELD OF THE DISCLOSURE

The invention relates to a BiMOS semiconductor device and a method for fabricating a BiMOS semiconductor device.

BACKGROUND OF THE DISCLOSURE

In numerous applications of semiconductor electronics it is advantageous for a semiconductor device in circuits integrated therein to include in addition to one or more MOS transistors also one or more bipolar transistors. Any such device will be referred to in this application as a BiMOS semiconductor device. When the MOS transistors comprise complementary transistors, i.e., n-channel transistors and p-channel transistors, it is referred to a BiCMOS semiconductor device.

Typical fields of application of bipolar transistors in BiCMOS semiconductor devices are, for example, low-noise amplifiers and constant current sources. For integration into a BiCMOS process there are known many structures of bipolar transistors. For instance, to this end it may be referred to the volume S. Wolf: "Silicon Processing For the VLSI Era", Vol. 2: Process Integration; Lattice Press, Sunset Beach, Calif., 1990.

The integration of bipolar transistors into a CMOS process, however, requires additional efforts compared to a pure CMOS process flow. Bipolar transistors are fabricated in the context of process modules that add additional masking steps to the CMOS process.

The technical object underlying the present invention is to provide a BiMOS semiconductor device that comprises in its integrated circuit a bipolar transistor in addition to a MOS transistor, wherein the bipolar transistor is configured such that it can be fabricated with particularly low effort.

SUMMARY OF THE DISCLOSURE

According to first aspect of the present invention a BiMOS semiconductor device including a semiconductor substrate is provided which comprises in a first active region and a second active region delineated by a field isolation region the following doped regions:
  a first doped region of a first conductivity type, hereinafter referred to as a deep well,
  a second doped region, hereinafter referred to as doped body region, of a second conductivity type that is inverse to the first conductivity type, wherein the doped body region overlaps with the deep well and has an extension in a depth direction perpendicular to the substrate surface that is less than that of the deep well, and
  a third doped region, hereinafter referred to as a depletion region, of the first conductivity type, whose depth extension is less than that of the doped body region.

In the BiCMOS semiconductor device according to the first aspect of the invention the first and second active regions are alike with respect to said first, second and third doped regions. That means that concentration profile and extension in depth of said doped regions are the same in the first and second active regions. This may be accomplished by a process flow as described layer in more detail, wherein these doped regions are formed in the first and second active regions, respectively, under identical conditions in the same process step using the same mask.

Furthermore, in the inventive BiMOS semiconductor a MOS transistor of the depletion type, a so-called depletion transistor, is formed in the first active region and comprising additional doped drain and source regions of the first conductivity type that extend past the depletion region and into the doped body region, while in the second active region a bipolar transistor is formed, whose base comprises the doped body region and whose collector comprises the deep well, wherein a doped emitter region of the first conductivity type and a doped base junction region of the second conductivity type are formed in the doped body region.

The semiconductor device according to the first aspect of the invention can be fabricated with particularly low process effort, since it uses the same basic structure of the doped regions as is also used in the MOS transistor of the same semiconductor device.

This doping structure relates to the above-identified first, second and third doped regions. In the context of the present application these regions are denoted, in addition to the numbered notation, by the terms "deep well", "doped body region" and "depletion region" as is typical in technology. Using the doped depletion region in the bipolar transistor has the advantage that leakage currents between the doped emitter region and the doped base junction region may be obviated.

Thus, in the inventive BiMOS semiconductor device the doping parameters of the first to third doped regions that are per se optimised for MOS transistors are concurrently used for the functional doped regions of the base and collector of a bipolar transistor. In this way, it is possible to integrate bipolar transistors into a MOS (that is, NMOS, PMOS or CMOS) process without changing the doping parameters of the MOS transistors and without adding a single additional masking step. In particular, the avoiding of additional masking steps for the fabrication of the bipolar transistors represents a substantial methodological advantage, thereby resulting in a cost efficient BiMOS semiconductor device. The implementation as a BiCMOS semiconductor device represents a preferred embodiment of the inventive BiMOS semiconductor device.

The inventive BiMOS semiconductor device uses the fact that the design of the well of MOS transistors of the depletion type provided for more degrees of freedom due to the differing requirements compared to, for instance, MOS transistors of the enhancement type, so-called enhancement transistors, usually used in CMOS logic.

With respect to the term "depletion region" it is to be noted: this region, having the same conductivity type as the deep well, serves to in the MOS transistor in the first active region for adjusting a "depletion mode" of the MOS transistor, contrary to the enhancement types. The usual notation "depletion transistor" for this mode of the MOS transistor is to be understood such that a depletion of this area near the surface only occurs upon switching off the transistor. During normal operation of the bipolar transistor in the second active region this region will never deplete of charge carriers.

In the following embodiments of the inventive BiMOS semiconductor device will be described. The embodiments may be combined with each other, unless explicitly described as alternatives to each other.

In one embodiment the bipolar transistor represents an npn bipolar transistor. In this embodiment the doped body region is thus p-doped, whereas the deep well is n-doped.

In a further embodiment the bipolar transistor is a pnp bipolar transistor, wherein the doped body region is thus n-doped and the deep well is p-doped. The respective bipolar transistors are formed in active regions that, in view of their dopings in the first to third doped regions, may also be used for respective MOS transistors of the depletion type.

In one embodiment the doped body region has a dopant concentration of $10^{16}$ to $10^{18}$ cm$^{-3}$ for achieving the second conductivity type. This corresponds to the advantageous parameter values of the body doping of MOS transistors of the depletion type, while also being an appropriate value for the base of bipolar transistors.

The extension of the doped body region in the depth direction is preferably between 300 and 700 nm, in a further embodiment between 300 and 600 nm.

The doped emitter region has preferably an extension in the depth direction between 100 and 300 nm, in particular of 200 nm.

The depth extension of the base region obtained in such embodiments between a lower boundary of the doped emitter region facing away from the substrate surface and an upper boundary of the deep well facing the substrate surface is preferably between 100 and 300 nm, in particular 200 nm.

In a further embodiment a third active region is provided in the BiMOS semiconductor device, in which a SONOS storage element is provided that comprises a channel region including the second doped region. In addition to a MOS transistor of the depletion type and a bipolar transistor in this embodiment also a channel region of the SONOS storage element is formed with one and the same mask.

According to a second aspect of the invention there is provided a method of fabricating a BiMOS semiconductor device. The method comprises the steps:
providing a semiconductor substrate that comprises in a first active region and a second active region delineated by a field isolation region the following doped regions:
a first doped region of a first conductivity type, hereinafter referred to as a deep well,
a second doped region, hereinafter referred to as doped body region, of a second conductivity type that is inverse to the first conductivity type, wherein the doped body region overlaps with the deep well and has an extension in a depth direction perpendicular to the substrate surface that is less than that of the deep well, and
a third doped region, hereinafter referred to as a depletion region, of the first conductivity type, whose depth extension is less than that of the doped body region.

The first and second active regions are treated absolutely equally during the fabrication of the first to third doped regions such that the first and second active regions equal each other in aforesaid first to third doped regions. In particular, this involves the usage of the same mask for fabricating a respective one of the first to third doped regions.
Moreover, the inventive method comprises the following steps:
A MOS transistor of the depletion type is formed in the first active region, wherein additional doped source and drain regions of the first conductivity type are formed so as to extend past the depletion region and into the doped body region, and
in the second active region a bipolar transistor is formed, whose base comprises the doped body region and whose collector comprises the deep well, wherein a doped emitter region of the first conductivity type and a base junction region of the second conductivity type are formed in the doped body region.

The inventive method is advantageous in that an integration of the bipolar transistors into a CMOS production process without an additional mask step is provided.

In the following embodiments of the inventive method are described. These embodiments can be combined unless being described as alternatives.

In one particularly preferred embodiment the first, second and third doped regions are formed in the first and second active regions by respective identical process steps with a respective identical mask.

In a further embodiment the emitter of the bipolar transistor is formed in the same implantation step as the source and drain implantation of the MOS transistor.

In a further embodiment, for avoiding recharging effects at the substrate surface, a lateral region between the emitter and the base in the second active region is exposed to an LDD implant that is concurrently introduced into the first active region.

In a further embodiment, either upon providing the semiconductor substrate or afterwards, in addition to forming the deep well a further well implant is formed in the second active region, which is concurrently introduced, upon forming CMOS devices, in the first active region or in other active regions provided on the semiconductor substrate.

DETAILED DESCRIPTION OF EXEMPLARY EMBODIMENTS

An embodiment of a BiMOS semiconductor device 100 is illustrated in FIG. 1 in a schematic cross-sectional view. For convenience, only a portion including an active bipolar transistor region is shown, which is denoted above as a second active region. The configuration of a MOS transistor in a first active region not shown herein is well-known to the skilled person and is also discussed above on the basis of embodiments of the BiMOS semiconductor device.

The bipolar transistor 100 is integrated in a p-doped substrate 102. In this embodiment p-conductivity corresponds to the second conductivity type according to the claim language and n-conductivity corresponds to the first conductivity type. An appropriate substrate material is p-doped silicon.

In this embodiment the bipolar transistor 100 is an npn-transistor. The bipolar transistor structures are implemented between the field isolation regions 104 and 108. An isolation region 106 is in the second active region between a doped collector junction region 122 and a doped base junction region 118. Field isolation regions 104, 108 and isolation regions 106 may be formed by, for instance, shallow trench technology or by LOCOS technology. Thus, an appropriate material for the isolation regions is silicon dioxide.

In this embodiment the doped collector junction region 122 is n$^+$-doped and extends from the substrate surface to an outer doped collector region 120 that is n-doped. The outer doped collector region 120 is positioned below the doped collector junction region 122, i.e., farther away from the substrate surface, and extends more deeply than the isolation region 106. Below the isolation region 106 the outer doped collector region 120 adjoins to a first doped region 110 that in this embodiment is n-doped. The first doped region 110 acts as a collector region in the bipolar transistor. The first doped region is also referred to as a deep well.

Above the deep well there is positioned a p-doped second doped region 112 acting as a base. The second doped region 112 is also referred to as doped body region and extends laterally from the field isolation region 104 to the isolation region 106. The doped base junction region 118 connects the buried second doped region 112 with the substrate surface and is p⁺ doped.

In this embodiment the doped base junction region 118 is formed concurrently together with source and drain regions of the MOS transistor in the first active region that is not shown. The doped base junction region may be configured in a ring-shaped manner and thus surrounds an outer doped emitter region 116. The doped outer emitter region 116, which is also referred to as "depletion region", is lightly n-doped (n⁻) in this embodiment, and is formed in a third doped region by an LDD (lightly doped drain) implantation step. The outer doped emitter region 116 is provided to avoid recharging effects at the substrate surface between emitter 114, 116 and base junction region 118.

At the same time an LDD implant is implanted in the first active region. The outer doped emitter region 116 surrounds an inner doped emitter region 114 and may be configured in ring-shaped way when viewed from a perspective to the substrate surface. It directly adjoins to the inner doped emitter region 114. In this embodiment the inner doped emitter region 114 is n⁺ doped.

The features of the BiMOS semiconductor device illustrated in FIG. 1 are briefly summarized below on the basis of their reference numerals.

100 BiMOS semiconductor device
101 active bipolar region, also denoted as second active region
102 substrate, p-doped. In this embodiment p-conductivity corresponds to the second conductivity type according to the wording of the claims.
104, 108 field isolation regions, formed in shallow trench technology
106 isolation region
110 first doped region, acts as collector region, also denoted as deep well, n-conductive. In this embodiment n-conductivity corresponds to the first conductivity type according to the wording of the claims.
112 second doped region, acts as base region, also denoted as doped body region, p-doped.
114 inner doped emitter region, n⁺ doped
116 outer doped emitter region, surrounds the inner doped emitter region, is formed in the third doped region ("depletion region") by LDD implantation step, is weakly n-doped (n⁻) and serves for avoiding recharging effects at the substrate surface between emitter and base junction region. LDD implant is concurrently implemented in the first active region.
118 doped base junction region, p⁺-doped, concurrently formed with source and drain regions of a MOS transistor in the first active region that is not shown.
120 outer doped collector junction region, n doped
122 doped collector junction region, n⁺ doped.

The invention claimed is:

1. A BiMOS semiconductor device including a semiconductor substrate
which comprises in each of first and second active regions delineated by a field isolation region the following doped regions:
a first doped region of a first conductivity type as a deep well,
a second doped region as a doped body region of a second conductivity type that is inverse to the first conductivity type,
wherein the doped body region overlaps with the deep well and has a depth from the substrate surface that is less than a depth of the deep well, and
a third doped region as a depletion region of the first conductivity type, a depth thereof is less than the depth of the doped body region:
wherein the first, second and third doped regions of the first active region are respectively substantially identical to said first, second and third doped regions of the second active region, and
wherein a MOS transistor of the depletion type having doped source and drain regions of the first conductivity type that extend, in a depth direction, past said depletion region and into said doped body region is formed in the first active region;
wherein a bipolar transistor is formed in the second active region;
wherein a base of the bipolar transistor comprises said doped body region;
wherein a collector of the bipolar transistor comprises said deep well; and
wherein a doped emitter region of the first conductivity type and a doped base junction region of the second conductivity type are formed in said doped body region of the bipolar transistor.

2. The BiMOS semiconductor device of claim 1, wherein said bipolar transistor is an npn bipolar transistor so that the doped body region is p-doped and the deep well is n-doped.

3. The BiMOS semiconductor device of claim 1 or 2, wherein said doped body region comprises a dopant having a doping concentration of $10^{16}$ to $10^{18}$ cm$^{-3}$ for achieving said second conductivity type.

4. The BiMOS semiconductor device of claim 1, wherein said doped emitter region has an extension in depth direction between 100 nm and 300 nm.

5. The BiMOS semiconductor device of claim 4, wherein said doped emitter region has an extension in the depth direction of 200 nm.

6. The BiMOS semiconductor device of claim 1, wherein said doped body region has an extension in depth direction between 300 nm and 700 nm.

7. The BiMOS semiconductor device of claim 1, wherein a distance between a lower boundary of the doped emitter region facing away from the substrate surface and an upper boundary of the deep well facing the substrate surface is between 100 and 300 nm.

8. The BiMOS semiconductor device of claim 1, wherein in the second active region in a lateral region between said doped emitter region and said doped base junction region an implant of the first conductivity type is superimposed on said third doped region, wherein the third doped region is formed by implantation, and the doping is adjusted to avoid a recharging effect at the substrate surface.

9. The BiMOS semiconductor device of claim 8, wherein said implant is concurrently introduced into the first active region as an LDD implant.

10. The BiMOS semiconductor device of claim 1, comprising a third active region in which a SONOS storage element is formed, wherein a channel region of the SONOS storage element comprises said second doped region.

11. The BiMOS semiconductor device of claim 1, further comprising, in addition to said MOS transistor, a complementary MOS transistor of depletion type, a source, a drain and a body region thereof and a deep well thereof each having a conductivity type inverse to the source, drain and body regions and deep well of the MOS transistor, respectively.

12. A method of forming a BiMOS semiconductor device, the method comprising:
   providing a semiconductor substrate that comprises in in each of first and second active regions delineated by a field isolation region
   the following doped regions:
   a first doped region of a first conductivity type as a deep well,
   a second doped region as a doped body region of a second conductivity type that is inverse to the first conductivity type,
   wherein the doped body region overlaps with the deep well and has a depth direction from the substrate surface that is less than a depth of the deep well, and
   a third doped region as a depletion region of the first conductivity type,
   a depth thereof being less than the depth of the doped body region,
   wherein the first, second and third doped regions of the first active region are respectively substantially identical to said first, second and third doped regions of the second active region;
   forming a MOS transistor of the depletion type in the first active region, wherein additional doped source and drain regions of the first conductivity type are formed so as to extend deeper than the depletion region and into the doped body region and
   forming a bipolar transistor in the second active region,
   a base thereof comprising the doped body region and
   a collector thereof comprising the deep well, and wherein
   a doped emitter region of the first conductivity type and
   a base junction region of the second conductivity type are formed in the doped body region of the bipolar transistor.

13. The method of claim 12, wherein the first, second and third doped regions are formed in the first and second active regions by respective identical process steps with a respective identical mask.

14. The method of claims 12, wherein the emitter of the bipolar transistor is formed in the same implantation step as the source and drain implantation of the MOS transistor.

15. The method of claim 12, wherein a lateral region between the emitter and the base in the second active region is exposed to an LDD implant that is concurrently introduced into the first active region.

16. The method of claim 12, wherein, upon providing the semiconductor substrate in addition to forming the deep well a further well implant is formed in the second active region, which is concurrently introduced upon forming CMOS devices.

* * * * *

UNITED STATES PATENT AND TRADEMARK OFFICE
CERTIFICATE OF CORRECTION

PATENT NO. : 8,405,157 B2
APPLICATION NO. : 12/593316
DATED : March 26, 2013
INVENTOR(S) : Uhlig et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 613 days.

Signed and Sealed this

First Day of September, 2015

Michelle K. Lee
*Director of the United States Patent and Trademark Office*